United States Patent [19]

Wilson et al.

[11] 4,370,609
[45] Jan. 25, 1983

[54] FAULT ISOLATOR FOR ELECTRIC UTILITY DISTRIBUTION SYSTEMS

[75] Inventors: Delano D. Wilson, Scotia; Dale E. Hedman, Schenectady, both of N.Y.

[73] Assignee: Power Technologies, Inc., Schenectady, N.Y.

[21] Appl. No.: 271,222

[22] Filed: Jun. 8, 1981

[51] Int. Cl.³ ............................................ G01R 31/02
[52] U.S. Cl. ...................................................... 324/51
[58] Field of Search ................................... 324/51, 52

[56] References Cited

U.S. PATENT DOCUMENTS 3,895,264  7/1975  Kirilloff .......................... 324/51 X
4,227,145  10/1980  Bonikowski et al. ................. 324/51

Primary Examiner—Stanley T. Krawczewicz
Attorney, Agent, or Firm—Hubbell, Cohen, Stiefel & Gross

[57] ABSTRACT

A device for locating faults on the lines of electrical power distribution systems, including generally a variable impedance means adapted for connection in series with an electrical power line, and means for switching such variable impedance means between a first low impedance value when an initial current $I_1$ of predetermined level flows on the power line for a predetermined period of time to enable detection of a fault condition, and a second high impedance value which limits the flow of current to a low level $I_2$. A meter or other indicating device provides a reading of the current $I_1$ to determine if a fault condition exists. In this fashion, the fault locator device limits both the magnitude and the time duration of the current when testing for a fault, so as not to adversely effect any system components.

15 Claims, 10 Drawing Figures

FAULT ISOLATOR FOR ELECTRIC UTILITY DISTRIBUTION SYSTEMS

TECHNICAL FIELD

The present invention relates to the detection of faults in electric power systems, and more particularly to a device for locating faults on the lines of electrical power distribution systems.

BACKGROUND ART

Faults on underground electrical power distribution systems are of increasing concern as the source of customer supply interruptions, particularly in view of the existing and foreseen installations of underground primary cable. Utility equipment and practices presently used to locate faults often cause time delays in restoring supply, can be a frequent cause of further system damage, and can involve significant costs during fault location.

While the currently available fault location equipment is technically adequate to locate all faults on distribution cables, it is very inefficient, especially if the distribution transformers are left connected. Usually a utility must maintain a wide range of fault locating equipment to be able to handle the different combinations of fault and cable types. Also it is desirable that the fault locating equipment operate without disconnection of distribution transformers and/or loads, in order to avoid customer downtime and practical difficulties. This, however, requires that the equipment be capable of discriminating between transformers and/or load characteristics and a fault. It is further desirable that, if current is allowed to flow in the fault during the detection interval, the current should not adversely effect system components or apparatus. If a fault current flows, it: (a) should not cause fuse blowing nor reach minimum-melt level of fuses; (b) should not impose detrimental duty on any system apparatus such as switches, reclosers, breakers, transformers, surge arrestors, etc; and (c) duration should be minimized.

In U.S. Pat. No. 4,227,145 there is disclosed an apparatus for detecting faults in electric cables, including (a) a solid state switch unit connected in series with the cable under test and the normal source of voltage supply of the cable when it is under load, (b) a metering unit having a resistor connected in series with the switch unit and a peak detector for measuring the voltage developed across the resistor, and (c) a trigger circuit having a manually operated trigger switch which causes the switch unit to be conductive for a preset period. This period is said to be long enough to allow the metering unit to indicate the size of the test current flowing through the resistor but not long enough in time for such current to damage the apparatus, the cable and its normal voltage supply. A fuse is connected in series with the solid state switch unit and is rated to blow before any damage occurs in such switch unit. The apparatus is employed to locate faults in low voltage distribution cables.

The apparatus in the above described U.S. Pat. No. 4,227,145 has the same disadvantages of some other known devices including its limitation to use in low voltage distribution cables and its operation to limit only the period of time during which the current flows and not also the magnitude of such current. Also, the patented apparatus requires auxiliary power for its operation and thus presents some limitation where power sources are not readily available in the field.

It is an object of the present invention to provide a fault locator for electrical power distribution systems which can be used at essentially all primary distribution high voltage levels.

It is another object to provide a fault locator which is readily adapted for use with different fuse ratings.

It is another object to provide a fault locator which limits both the magnitude and time duration of the current so as not to adversely effect system components.

It is a further object to provide a fault locator which requires no auxiliary power to operate to thereby facilitate field testing.

DISCLOSURE OF THE INVENTION

These, and other objects, are achieved by the present invention which provides a device for locating faults on the lines of electrical power distribution systems, including generally a variable impedance means adapted for connection in series with an electrical power line, and means for switching such variable impedance means between a first low impedance value when an initial current $I_1$ of predetermined level flows on the power line for a predetermined period of time to enable detection of a fault condition, and a second high impedance value which limits the flow of current to a low level $I_2$. A meter or other indicating device provides a reading of the current $I_1$ to determine if a fault condition exists.

In one embodiment, the variable impedance means comprises a transformer having its primary connected in series with the power line, and its secondary connected in series with a tapped reactor and an SCR switching gate. A current meter and a current transformer are also connected in the secondary circuit at the gate terminals of the SCR's used in the switching gate. Initially the tapped reactor is set to provide a reactor impedance which limits the current to a predetermined level which is above other current levels which are not fault currents but yet is below that current level which will damage other equipment or blow fuses in the particular power line, and thus is sufficiently high to indicate that a fault has occurred. To test for a fault condition, a power line switch is activated to connect the variable impedance means in the power line. This causes a voltage in the transformer secondary sufficient to close the SCR switching gate and cause a current $I_1$ to flow in the transformer primary which is limited by the tapped reactor impedance and the leakage impedance of the transformer. The current $I_1$ flows for a predetermined period or loop during which time it reaches its maximum value and then goes back to essentially zero current, at which time the SCR switching gate opens so that the very high magnetizing impedance of the transformer is effectively in series with the power line to cause a low current $I_2$ to flow.

In this fashion, the fault locator device limits both the magnitude and the time duration of the current when testing for a fault, so as not to adversely effect any system components.

BEST MODE FOR CARRYING OUT THE INVENTION

Figure 1:
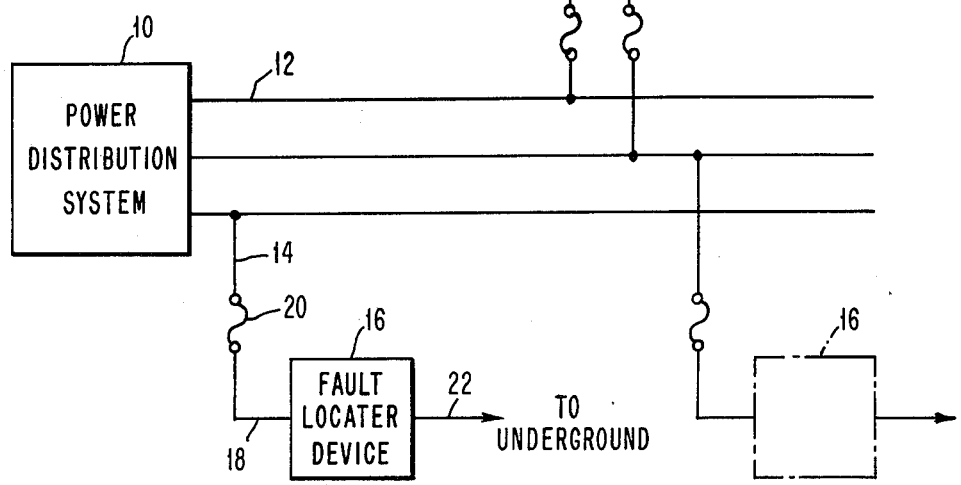
FIG. 1 shows a general system diagram of a power distribution system employing the fault locator devices of the present invention.

Referring to FIG. 1 there is shown a general system diagram of a power distribution system 10 which provides electrical power on feeder lines 12 and lateral lines 14 leading to the underground. A fault locator device 16 is connected to each lateral line 14 to be tested in the manner shown by the detailed circuit drawing of fault locator device 16 as shown in detail in FIG. 2. Device 16 is series connected to the underground lateral line 14 via an incoming power line 18 and a fuse 20, and an outgoing power line 22 leading to the underground. FIG. 3 shows the external equipment in which the device 16 is contained, including the circuit and fuse switches and a current meter 16 to be described below.

Referring again to FIG. 2, device 16 comprises an on/off switch 24 for connecting such device 16 into the power line 18, and a transformer 26 having its primary 28 connected in the power line between the switch 24 and line 22. The transformer secondary 30 is connected to a tapped reactor 32 having its tap 34 connected to an SCR gate circuit 36 comprising a pair of thyristors 38 and 40 connected in inverse, parallel relationship. The SCR gate circuit 36 is also series connected to a current transformer CT 42 and a current meter 46 or other visual indicator which in turn is connected to the transformer secondary 30. The current transformer 42 is also connected to both gates of the thyristors 38 and 40. Reactor 32 has its tap 34 set by a selector switch 48 on the device panel to a position which provides a reactor impedance that limits the current to an amount related to the fuse rating of the line.

It is to be noted that the SCR gate circuit 36 can, if desired, also include a separate battery source 44 which provides a pulse voltage to gate the thyristors on immediately when the switch 24 is closed.

Figure 4:
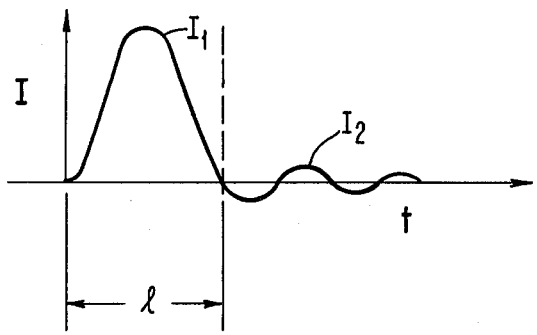
FIG. 4 is a graph showing the desired current-time relationship for the current flowing in the fault locator device.

To test for a fault condition, reactor 32 is tapped to provide an impedance in the circuit which limits the current to a predetermined value, essentially equal to a multiple, e.g., 20 times, of the full load current of the feeder lines 14 and 18 under test. This reactor setting will limit the current such that it is above the other current levels which are not fault currents, but yet is below that current level which will damage other equipment or blow fuses, and thus is sufficiently high to indicate that a fault has occurred. Switch 24 is closed by a manual actuator 50 on the device panel which provides sufficient voltage on the power line to re-establish the fault but not damage other system components, such as transformers, switches and fuses. A timing circuit 52 is connected to the switch 24 and is initiated when the circuit switch actuator 50 is tuned to the on position. The pulse voltage from the transformer secondary 30 is sufficient to turn the thyristors 38 and 40 on, and the current flowing in the transformer primary 28 is limited by the tapped reactor impedance and the leakage impedance of the transformer for one loop 1 of current, herein defined as that period of time when the current $I_1$ shown in FIG. 4 in the power line or transformer primary 28 goes from zero to a maximum value and then back to zero. FIG. 4 illustrates the approximate desired current-time relationship for the fault locator device 16 with the current $I_1$ flowing for one time loop 1 when the reactor is in circuit as defined above.

As the current $I_1$ completes its loop 1, the thyristors 38 and 40 are gated off by the current transformer 42 to prevent a second loop of high current from flowing. The current transformer 42 senses the high secondary current and causes the thyristors 38 and 40 to be gated off by effectively placing a turnoff voltage at their gates. This produces an open circuit condition for the transformer secondary 30, leaving the magnetizing impedance of the transformer 26 in series with the line being tested. This magnetizing impedance is typically very high, in the order of 10,000 ohms to 1 megohm, for example. Consequently, a very low current, indicated by $I_2$ in FIG. 4, flows in the line being tested. Timing circuit 52 is set to open the switch 24 after between 20–100 milliseconds.

Meter 46 thus provides an indication of the current $I_1$ value to detect a fault when the thyristors 38 and 40 are conducting and the tapped reactor impedance and the leakage impedance of transformer 26 constitute essentially the total impedances as reflected back into the transformer primary 28, thereby limiting the value of current pulse $I_1$. If this current pulse $I_1$, is above a preset threshold value set to indicate a fault condition on meter 46, the thyristors 38 and 40 will turn off and the current loop continues, as $I_2$ shown, until switch 24 opens. Under a no fault condition, when switch 24 is closed, the current $I_1$ will be lower than the present threshold value of the meter and, hence, the current $I_1$ will not be detected. The threshold current of meter 46 is, for example, about 12 times the full load current.

Conceptually, the device 16 is similar to a small series transformer and contactor, which will supply a single half cycle of predetermined current magnitude $I_1$ to the system. The output current of device 16 is then reduced to virtually zero by changing the impedance of the transformer, and quickly interrupted. Instantaneous current levels are monitored if a fault is present. With experience, approximate location of a fault may be possible. To operate, the utility personnel would connect the device 16 at lines 18 and 22, set the selector switch 48 to the fuse rating, initiate testing with the manual actuator 50 for switch 24, and observe a "fault"-"no fault" status reading on meter 48.

Figure 2:
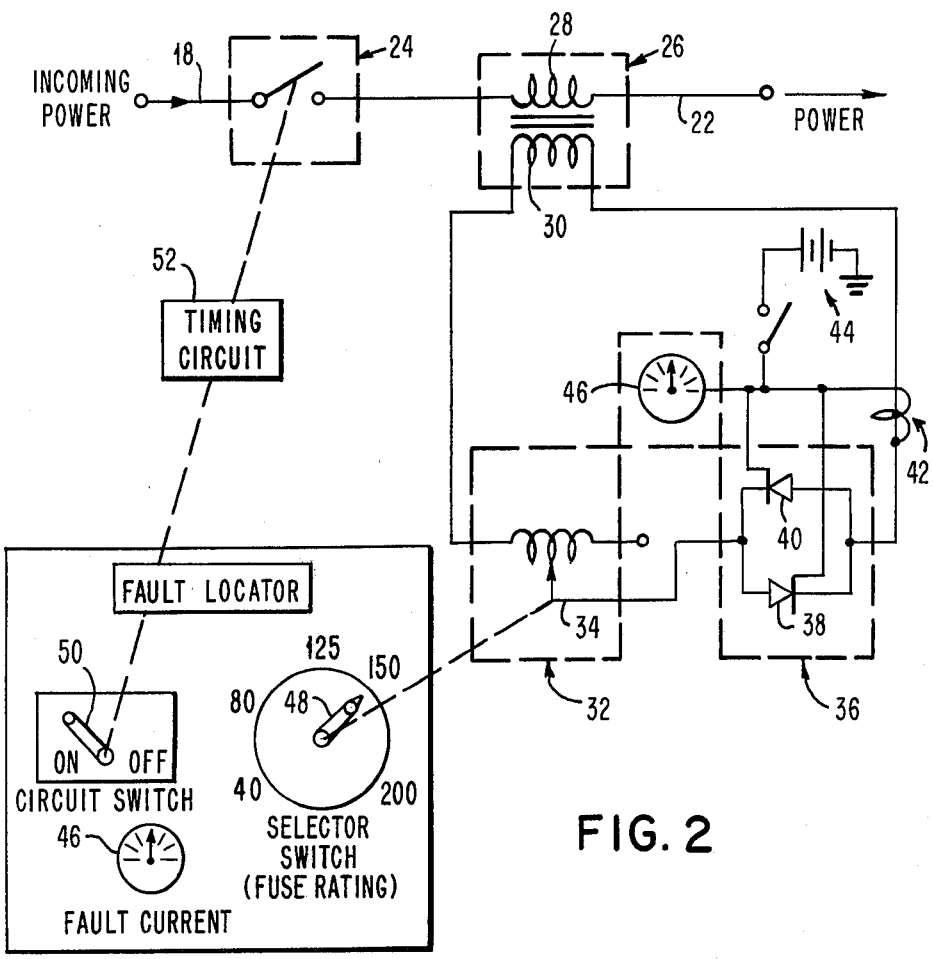
FIG. 2 is a detailed circuit diagram of a fault locator device, illustrative of one preferred embodiment of the invention.
Figure 3:
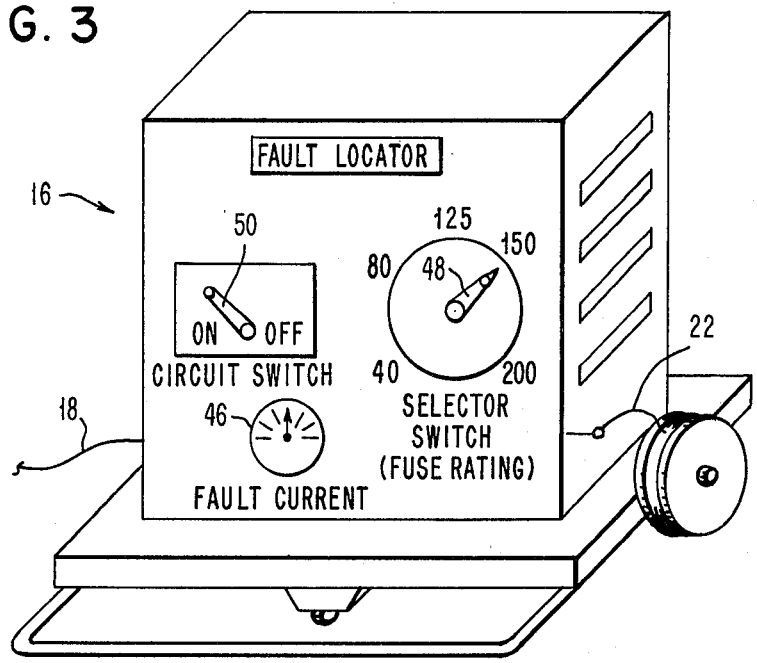
FIG. 3 is a perspective view of the external equipment in which the fault locator device is contained.
Figure 5:
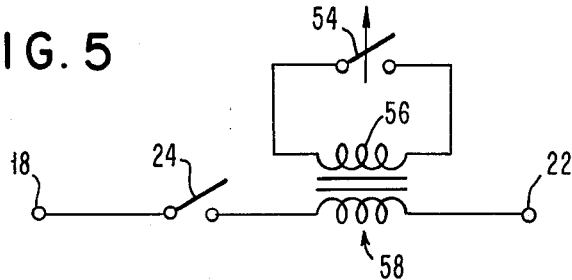
FIG. 5 is a simplified circuit schematic showing the functional operation of the fault locator device.

To illustrate the practicability of the fault locating device of the present invention, a simplified embodiment of the device 16 shown in FIG. 2 is shown in FIG. 5 wherein a switch 54 is connected to the secondary 56 of a specially designed transformer 58. Circuit switch 24 connects the power lines 18 and 22 in the same manner as shown and described with reference to the device 16 shown in FIG. 2. Here, the initial impedance with the secondary switch 24 in the closed condition is the leakage reactance of transformer 58 causing a current $I_1$, whereas the final impedance with the switch 54 open is the relatively high magnetizing impedance of such transformer. A gapped core, not shown, can be used to minimize harmonic current.

In the example system analyzed below, a 15 kV system has been selected, although it should be understood that the invention is applicable across the entire high voltage distribution system voltage range of, for example, 4 kV through 35 kV. Also, the approximate desired current time relationship for the device of FIG. 5 is shown in FIG. 4, described above with respect to the device in FIG. 1. The switching from leakage reactance to magnetizing reactance is straight forward since the thyristors used in switch 54 will clear at a zero current.

The example system parameters selected for the following representative analysis are:

(a) 15 kV system (8660 volts line-ground).

(b) Fuse is rated at twice the lateral full load.

(c) The short circuit current in the feeder as limited by the system is 200 amps rms symmetrical to 20,000 amps rms symmetrical. This range is estimated to include approximately 95% of laterals.

(d) Lateral fuses can be of any type applied on a utility system (e.g., current limiting, power fuses, etc.).

Based on these parameters, a hypothetical range of feeder full load currents and the associated fuse ratings were employed as illustrated in Table 1. Certain of the fuses do not correspond to standard ratings, but illustrated the generic requirements. It is recognized that lateral radial full load ratings above 70 amps (and the associated fuse ratings) are rare.

TABLE 1

| Lateral Full Load (amps) | Fuse Rating (amps) |
| --- | --- |
| 20 | 40 |
| 40 | 80 |
| 62.5 | 125 |
| 70 | 140 |
| 100 | 200 |

The inrush to a distribution transformer (unloaded) can be approximately 25 times full load rating. This only occurs under very idealized conditions, such as full residual flux, a "stiff" infeeding system (i.e., very high short circuit capability), no damping and, as indicated, no load. A more practical maximum value at the lateral tap is estimated to be in range of fifteen times full load rating. Also, the limited data on cold load pickup currents, which include the effects of transformer inrush, have typically been recorded in the range of 4-8 times feeder full load. For purpose of this description, it is assumed that maximum lateral pickup inrush currents are in the order of 10-12 times full load. To discriminate between fault currents and lateral pickup current, the initial current value ($I_1$) must exceed 10-12 times full load without infringing on the fuse minimum melt or being detrimental to other system elements. For these conditions, a preferred maximum fault detection value of 20 times full load current was selected. These values are well within system component momentary or short-time current limits. For this value, the lowest minimum melt times for the various fuses are summarized in Table 2.

TABLE 2

| Fuse Rating (amps) | 20 × Lateral Full Load (amps) | Minimum Melt Time (seconds) |
| --- | --- | --- |
| 40 | 400 | 0.02 |
| 80 | 800 | 0.02 |
| 125 | 1250 | 0.05 |
| 140 | 1400 | 0.10 |
| 200 | 2000 | 0.10 |

These minimum melt times correspond to a range of 1.2 cycles to 6 cycles, which are within the criteria of FIG. 4. The impedance necessary to limit the fault currents to the values of Table 2, assuming a 20,000 amp source, were calculated. The resultant fault current was also calculated for a source of 2000 amps (i.e., the lower end of the assumed range) were present. These values are given in Table 3.

TABLE 3

| | | | (all currents in rms) | |
| --- | --- | --- | --- | --- |
| Lateral Full Load (amps) | Fuse Rating (amps) | Initial Impedance of Device (ohms) | Initial Current Through Device ($I_1$) For 2000 amp Source | |
| | | | (amps) | Times (F.L.) |
| 20 | 40 | 21.11 | 338 | 16.90 |
| 40 | 80 | 10.39 | 588 | 14.70 |
| 62.5 | 125 | 66.50 | 800 | 12.80 |
| 70 | 140 | 5.75 | 859 | 12.27 |
| 100 | 200 | 3.90 | 1052 | 10.52 |

Therefore, for the 2000 ampere (weak) source, the fault current is sufficiently high to discriminate a fault from feeder inrush (i.e., above 10-12 times full load) except for the 100 ampere circuit. In this case, two or three closures of the device might be required for the very low source short circuit capacities. The object of the several closures is that if a fault is present, every closure will result in at least the threshold value of fault current, whereas only a limited number of the closures (if any) will result in a maximum inrush. This is due to variations in residual and point of wave closing of the switching device. In practice, the transformer residuals will tend to be very low because of the "lossy" loads on the secondary. Also, the type of switches involved will tend to make electrical contact at or near a voltage maximum, resulting in minimum current offset.

Surge currents when picking up only the cable were calculated to verify their unimportance. The currents range from 43 amperes (asymmetric) for the 20 amp circuit to 97 amperes (asymmetric) for the 100 amp circuit, again rms values. These neither interfere with fault discrimination nor adversely affect system components.

As previously discussed, the voltage on the cable with the initial impedance inserted must be near normal system voltage to ensure breakdown of the fault path. For the impedances of Table 3, and assuming full load is present, the voltages on the cable range from approximately 90 to 98% of normal system voltage depending on the normal feeder full load and the source system capacity. If the cold load level was, for example, 5 times the full load level, with a 0.7 power factor, the voltages would be approximately 85% (for the 100 amp full load feeder) to 95% for the 20 amp full load feeder. Recognizing that the 85% value is under very severe (or abnormal) conditions of a 100 ampere feeder and cold load of 5 times full load, the resultant voltages appear sufficient to re-initiate the fault.

Another parameter is the value of the voltage impressed on the cable and associated transformers, loads, etc., for the various operating modes of the device. The two voltage extremes will occur when (a) the second (highest) reactance is effective, (b) the cable is unloaded, resulting in the highest voltage rise, and (c) the full load is present, resulting in the largest voltage drop.

It was assumed that the current would be limited to a value in the range of 5-10 amperes. Based on a 5 amp limit, voltages on the cable under no load conditions would be approximately 130% of normal and the voltage under full load-depending on the feeder (or fuse) ratings would vary from approximately 2% to 15% of normal. Recognizing that these voltages would be impressed for a very short time, less than typical system fault clearing times, the 130% overvoltage is likely not a serious concern and the low voltages should not be important. If the current were limited to 10 amperes, the maximum voltage would be approximately 113% and the minimum would vary from approximately 4% to 25%. These latter values are of minimal consequence for the short periods of time contemplated. These calculations indicate that for reasonable ranges of currents, defined as non-detrimental to the system and capable of interruption by a simple switch, lateral voltages can be controlled to values compatible with system integrity.

The time constants associated with closing into a 0.7 power factor load were calculated. They are approximately 0.15 to 0.20 cycles and therefore should not present a problem in fault discrimination.

Keeping size and weight of the resultant device to a minimum is most important. For initial estimating purposes, the approximate kVA rating of the components can be calculated and the physical characteristics of commercially available devices obtained. The commercially available devices will be larger and heavier than those specifically designed for the proposed equipment. It is estimated that for a transformer as in the example, the actual device would be 50-75% of the weight and size of a conventional commercially available transformer which could meet the necessary requirements.

To determine a commercial transformer adequate for the foregoing requirements, the limitation on minimum rating would be due to either temperature limits ($i^2t$) or mechanical short circuit strength limits. Short circuit strength for the type of device envisioned is not likely to be limiting since obviating measures can be incorporated which are not practical in a commercial transformer. For example, epoxy bonded windings, or reinforced windings, can be used. Therefore, the temperature limited rating was calculated. These ratings are listed in Table 4 below:

TABLE 4

| Lateral Full Load (amps) | Fuse Rating (amps) | "Commercial" Transformer Rating (kVA) |
|---|---|---|
| 20 | 40 | 13 |
| 40 | 80 | 26 |
| 62.5 | 125 | 40 |
| 70 | 140 | 44 |
| 100 | 200 | 63 |

From the above, it can be seen that the fault locator device of the present invention generally involves the insertion of an impedance in series with the lateral line of an electrical power distribution system. Such impedance is switched between a first impedance or reactance values to cause a first high current $I_1$ to flow for one loop to enable detection of a fault condition, and a second impedance or reactance value to cause a low current $I_2$ to flow in the line being tested. FIGS. 6 through 10 show alternate embodiments of the tapped reactor fault locator device shown in FIG. 2. It is noted that, for convenience in describing the FIGS. 6-10, identical reference numerals are used to represent the same circuit elements as those shown and described with reference to FIG. 2.

Figure 6:
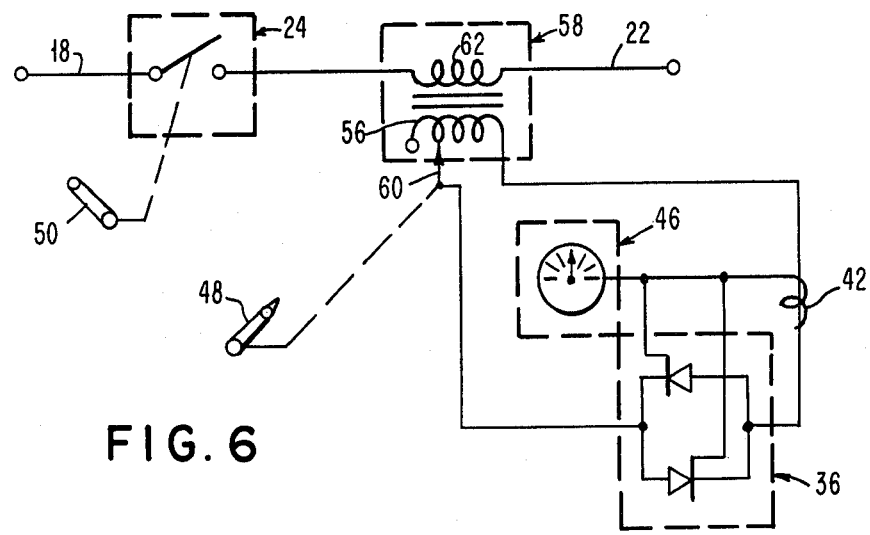
FIG. 6 is a more detailed diagram of the device shown in FIG. 6 employing a switched transformer secondary to provide two impedances.

More particularly, FIG. 6 shows the fault locating device of FIG. 5 in greater detail wherein the simplified switch 54 described in FIG. 5 is comprised of the SCR gate circuit 36 and the current transformer 42. Transformer secondary 56 is tapped by a contact 60 which is adjusted by the manual selector switch 48 for the proper leakage impedance to coordinate with the particular fuse rating of the line under test. It is noted that while a tap is shown on the secondary 56, a similar effect can be achieved by tapping the primary 62 or both the secondary 56 and the primary 62. In either tapping arrangement, the initial impedance with the SCR gate switch 36 closed comprises the leakage reactance of the transformer 58 which limits the current $I_1$ whereas the final impedance with the SCR gate switch 36 open comprises the relatively high magnetizing impedance of the transformer 58 which limits the current $I_2$ to a very low level.

Figure 7:
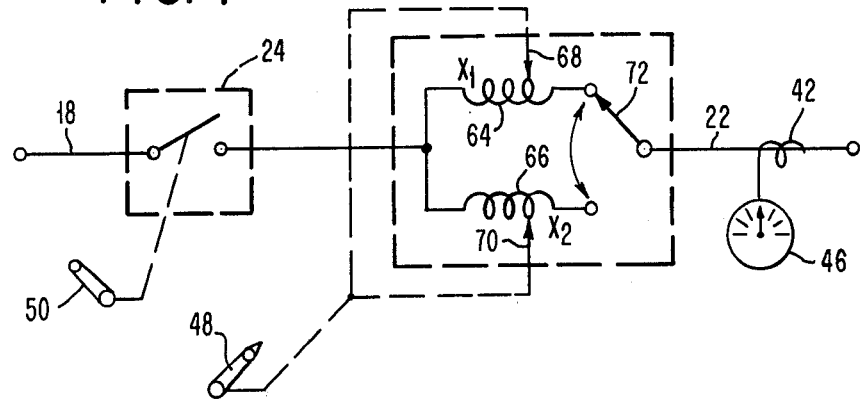
FIG. 7 shows another embodiment of the fault locator device employing two separate reactors which are automatically switched into the power line.

The fault locator device shown in FIG. 7 operates essentially by the switching of two reactances $X_1$ and $X_2$ provided by two tapped reactors 64 and 66 connected respectively by contacts 68 and 70 to the fuse rating selector switch 48. Reactors 64 and 66 are connected to the power lines 18 and 22 by switch 24 and an automatic switching device 72. The meter 46 and current transformer 42 are connected to line 42. The automatic switching device 72 can be either a conventional mechanical switch, such as a vacuum, air or oil actuated switch, or a conventional electronic switch, such as an SCR switch, not shown. Reactor 64 provides a first reactance value $X_1$, which limits the initial current $I_1$, to a value that is less than the level causing fuse blowing or the minimum melt level, but is sufficiently high to determine if a fault is present. Switch 72 rapidly connects the reactor 66 to insert the second reactance value $X_2$ to limit the current to a very low level $I_2$.

Figure 8:
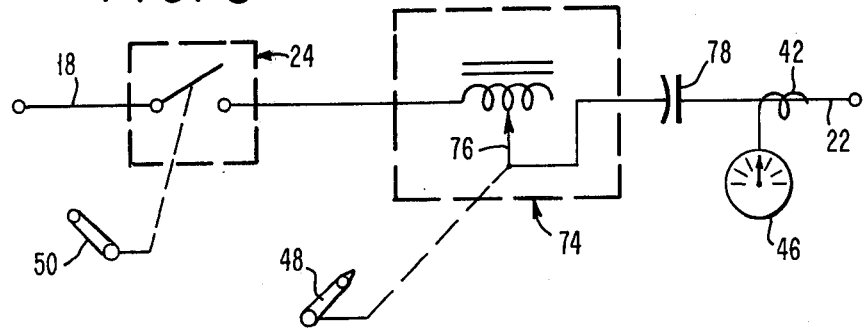
FIG. 8 shows another embodiment of the fault locator device employing a simple tuned circuit.

FIG. 8 shows a fault locator device which operates as a simple LC tuned circuit and includes a saturable reactor 74 which is tapped by a contact 76 to obtain the appropriate impedance to coordinate with the fuse rating. A current limiting capacitor 78 is connected in the line 22 in series with the saturable reactor 74 and the meter 46 and current transformer 42. When the current exceeds a specific predetermined level, the reactor 74 saturates to thereby increase the total reactance. This results in a capacitive current limiting reactance with a very low current.

Figure 9:
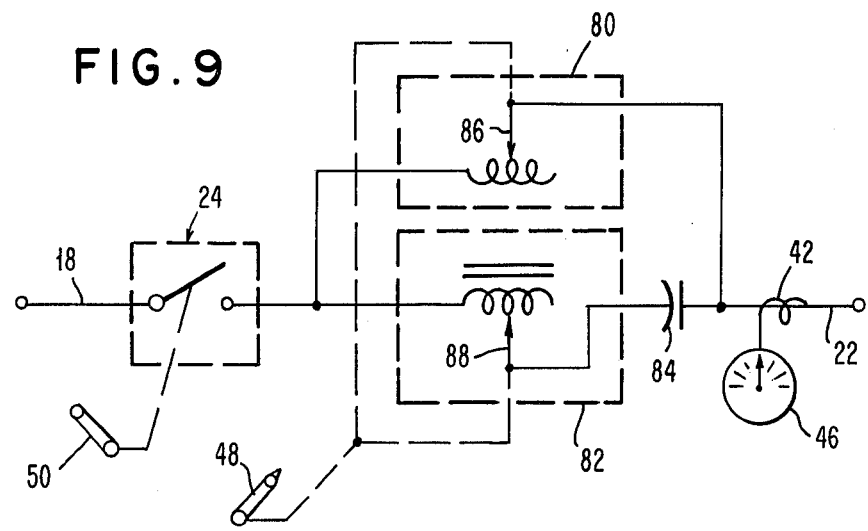
FIG. 9 shows another embodiment of the fault locator device employing a complex tuned circuit.

FIG. 9 shows a fault locator device which operates as a complex tuned circuit and includes a first tapped reactor 80 connected in parallel with a series LC comprising a second tapped reactor 82, of the saturable type, and a capacitor 84. The series LC is normally tuned to 60 Hz. The series reactor 82 saturates at a specific, known current level resulting in a high impedance resonant circuit to limit the current to a very low value. Here, either or both reactors 80 and 82 are tapped at 86 and 88, respectively to provide the appropriate impedances for the fuse ratings.

Figure 10:
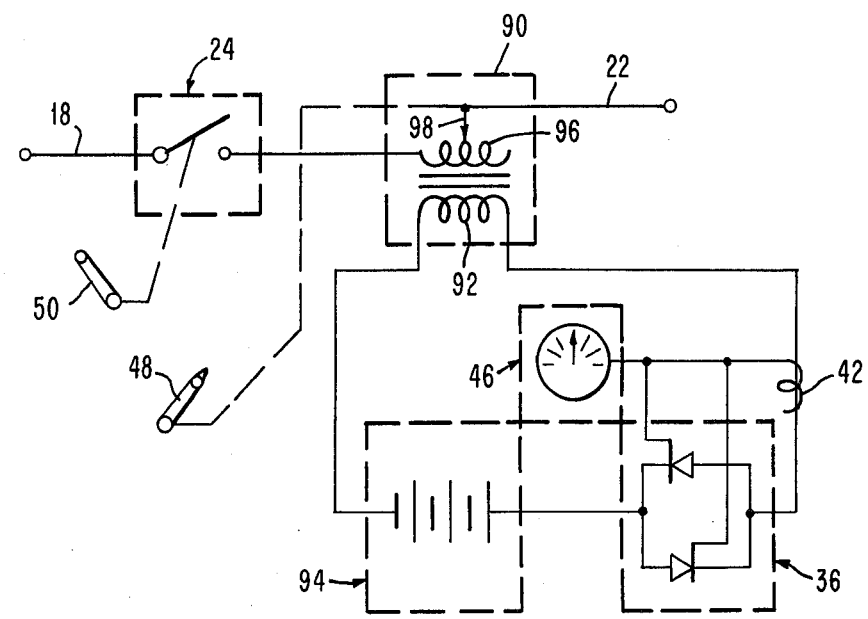
FIG. 10 shows still another embodiment of the fault locator device employing a d.c. saturable transformer.

FIG. 10 shows a fault locator device which operates as a d.c. saturable device. Here, a saturable reactor transformer 90 is connected in the power line with its secondary 92 connected in series with a d.c. source 94 and the SCR switching gate 36 and current transformer 42 combination described above. The secondary switching gate 36 is closed for an initial period during which time the device exhibits a low (air core) reactance. When the switching gate 36 is opened, the transformer 90 becomes unsaturated and a high impedance results. The primary 96 can be tapped at 98 to provide the appropriate air core reactance to coordinate with the fuse ratings.

While the invention has been described above with respect to its preferred embodiments, it should be understood that other forms and embodiments may be made without departing from the spirit and scope of the invention.

What is claimed is:

1. Apparatus for detecting faults on a power line in an electrical power system; comprising:
    a variable impedance means which provides a first low impedance and a second high impedance;
    power line switching means for connecting said variable impedance means in series with said power line to provide a sufficient voltage on said power line to cause an initial current $I_1$ to flow to test for a fault; and
    said variable impedance means including reactance means responsive to said initial current $I_1$ of predetermined value to cause said variable impedance means to exhibit said first low impedance while said initial current $I_1$ flows for a predetermined period of time to enable detection of a fault condition, and reactance switching means responsive to said initial current $I_1$ to cause said variable impedance means to exhibit said second high impedance thereby limiting the flow of current to a low level $I_2$;
    whereby said apparatus limits both the magnitude and time duration of the current so as not to adversely effect system components.

2. Apparatus as recited in claim 1, further comprising meter means connected to said variable impedance means for providing an indication of said current flow $I_1$.

3. Apparatus as recited in claim 1, further comprising a timing means connected to said power line switching means for opening said switching means to disconnect said impedance means from said power line at a predetermined time after said current $I_2$ flows.

4. Apparatus as recited in claim 1, wherein said variable impedance means comprises a transformer having its primary connected in said power line, and its secondary connected in series with a reactor and a reactor switch for connecting said reactor into and out of the secondary circuit, said reactor impedance and the leakage impedance of said transformer constituting said reactance means of said variable impedance means to produce said first low impedance, and said reactor switch constituting said reactance switching means to disconnect said reactor to produce an open circuit secondary causing the magnetizing impedance of said transformer to produce said second high impedance.

5. Apparatus as recited in claim 4, wherein said reactor is tapped to provide said first low impedance which limits the power line current to a level about other current levels which are not fault currents, but is below that current level which will damage other system equipment or blow fuses, and thus, is sufficiently high to indicate that a fault has occurred.

6. Apparatus as recited in claim 5, further comprising a fuse rating selector switch connected to said tapped reactor to provide a first low impedance that limits the power line current to amount equal to the fuse rating of the power line under test.

7. Apparatus as recited in claim 4, wherein said reactance switching means comprises an SCR gate circuit comprising a pair of thyristors connected in inverse parallel relationship in series with said transformer secondary, said thyristors having their gates connected to a source of turn-on power when said power line switching means connects said variable impedance means to said power line.

8. Apparatus as recited in claim 1, wherein said variable impedance means comprises a transformer having its primary connected in said power line, and its secondary being tapped to provide an appropriate reactance connected in series with a reactance switch for opening and closing said secondary circuit, said leakage reactance of said transformer comprising said reactance means which produces said first low impedance of said variable impedance means, and said reactance switch comprising said reactance switching means to disconnect said secondary causing the relatively high magnetizing impedance of said transformer to produce said second high impedance.

9. Apparatus as recited in claim 1, wherein said variable impedance means comprises reactance means in the form of a pair of tapped reactors providing a first low impedance and a second high impedance, respectively, and said reactance switching means comprises a switch for selectively connecting each of said tapped reactors into said power line.

10. Apparatus as recited in claim 1, wherein said variable impedance means comprises a saturable reactor connected in said power line in series with a current limiting capacitor to form a tuned LC circuit, the unsaturated reactance of said saturable reactor and the reactance of said capacitor constituting said first low impedance, and said saturated reactance of said saturable increasing the impedance to said second high impedance resulting in a capacitive current limiting reactance with a very low current.

11. Apparatus as recited in claim 1, wherein said variable impedance means comprises a first reactor connected in parallel with a series combination of a second reactor and a capacitor which are tuned to a predetermined frequency, said variable impedance means providing said first low impedance when said second reactor is in the unsaturated condition, and said second reactor saturating at a predetermined current level thereby increasing the impedance to said second high impedance in a resonant circuit which limits the current to a very low value.

12. Apparatus as recited in claim 1, wherein said variable impedance means comprises a d.c. saturable device having a saturable reactor transformer connected in series with said power line with its secondary connected in series with a d.c. source and a switching means.

13. Apparatus as recited in claim 1, wherein said variable impedance means comprises a d.c. saturable device including a saturable reactor transformer connected in series with said power line, and a d.c. source and switching means connected in series with the secondary of said saturable reactor transformer for switching said d.c. source into and out of said transformer secondary circuit, said switching means being closed to cause said saturable reactor transformer to saturate and exhibit said first low impedance while said initial current $I_1$ flows for a predetermined period of time to enable detection of a fault condition, and said switching means being open to cause said saturable reactor transformer to exhibit said second high impedance thereby limiting the flow of current to a low level $I_2$.

14. Method for detecting faults on a power line in an electrical power system, comprising:

connecting a variable impedance means in series with the power line to provide a voltage sufficient to re-establish the fault on said power line, said variable impedance means being adapted for switching between a first low impedance and a second high impedance:

switching said variable impedance means to a first condition whereby it exhibits said first low impedance and an initial current $I_1$ of predetermined value flows for a predetermined period of time to enable detection of a fault condition:

after said predetermined period, switching said variable impedance means to a second condition whereby it exhibits said second high impedance thereby limiting the flow of current to a low level $I_2$;

whereby both the magnitude and time duration of the current are controlled so as not to adversely effect system components.

15. Method as recited in claim 14, further comprising adjusting said high and low impedance values of said variable impedance means to a predetermined first low impedance that limits the power line current to an amount related to the fuse rating of the power line under test.

* * * * *